(12) United States Patent
Yang et al.

(10) Patent No.: US 6,362,101 B2
(45) Date of Patent: *Mar. 26, 2002

(54) CHEMICAL MECHANICAL POLISHING METHODS USING LOW PH SLURRY MIXTURES

(75) Inventors: Ming-Sheng Yang; Juan-Yuan Wu, both of Hsinchu; Water Lur; Shih-Wei Sun, both of Taipei, all of (TW)

(73) Assignee: United Microelectronics Corp., Hsin-Chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/976,605

(22) Filed: Nov. 24, 1997

(51) Int. Cl.[7] ............................................. H01L 21/302

(52) U.S. Cl. ..................... 438/689; 438/690; 438/691; 438/692; 438/693

(58) Field of Search ................................. 438/692, 690, 438/691, 693, 689

(56) References Cited

U.S. PATENT DOCUMENTS

| | | | | |
|---|---|---|---|---|
| 5,395,801 A | * | 3/1995 | Doan et al. | 437/225 |
| 5,759,917 A | * | 6/1998 | Grover et al. | 438/690 |
| 5,770,095 A | * | 6/1998 | Sasaki et al. | 216/38 |
| 5,795,495 A | * | 8/1998 | Meikle | 216/88 |
| 5,795,826 A | * | 8/1998 | Gambino et al. | 438/692 |
| 5,849,637 A | * | 12/1998 | Wang | 438/699 |
| 5,866,031 A | * | 2/1999 | Carpio et al. | 252/79.1 |
| 5,876,508 A | * | 3/1999 | Wu et al. | 134/2 |

* cited by examiner

Primary Examiner—Benjamin L. Utech
Assistant Examiner—Vanessa Perez-Ramos
(74) Attorney, Agent, or Firm—Rabin & Berdo

(57) ABSTRACT

A method for chemical mechanical polishing a component includes providing an oxide layer and forming at least one via through the oxide layer. A tungsten layer is formed within the via and over the oxide layer. A first chemical mechanical polishing step is carried out on a polishing pad using a first slurry having an oxidizing component and having a pH of approximately 2 to approximately 4 to remove the tungsten layer from over the oxide layer. A second chemical mechanical polishing step is carried out on the polishing pad using a second slurry having a pH of approximately 2 to approximately 4 to polish scratches out of the oxide layer.

3 Claims, 3 Drawing Sheets

CHEMICAL MECHANICAL POLISHING METHODS USING LOW PH SLURRY MIXTURES

BACKGROUND OF THE INVENTION

1. Field of the Invention

The present invention relates to planarizing surfaces during the formation of integrated circuit devices. More particularly, the present invention relates to improved methods for carrying out chemical mechanical polishing (CMP).

2. Description of the Related Art

During the fabrication of integrated circuit devices, it is often necessary to remove material from the surface of the device at one or more stages of the fabrication process and to planarize material layers before proceeding with further processing steps. With increasing frequency, material removal and planarization are accomplished using chemical mechanical polishing (CMP). CMP processes are carried out by holding a wafer against a rotating polishing surface with a controlled pressure in the presence of a slurry. The slurry often includes both a chemically active component such as an acid or base and a mechanically active, abrasive component such as fine particles of silicon oxide. Though the exact mechanisms are poorly understood, chemical reactions and mechanical abrasion contribute to the polishing and planarization process. CMP methods have been developed for planarizing both metal layers and dielectric layers.

CMP processes may be used for polishing multiple layers in an integrated circuit device. For example, devices such as FETs, diodes or transistors are formed in and on a substrate and then a first level of insulating material is deposited over the integrated circuit device. A pattern of contact holes or vias is defined through the first level of insulating material and, at some point in the process, the vias are filled with a conducting material to define vertical interconnects through the first level of insulating material to contact appropriate portions of the devices on the surface of the substrate. Because certain wiring line metals such as aluminum do not provide adequate fill within the vias, and it is common to fill the vias with tungsten deposited using chemical vapor deposition (CVD). Depositing CVD tungsten into the via results in a layer of tungsten being formed over the insulating material as well as within the via through the insulating material. After the via is filled, the layer of tungsten that overfilled the via is removed and an aluminum wiring line is deposited over the dielectric layer and over the via. The layer of tungsten may be removed using an etch back step such as reactive ion etching (RIE). The RIE step, however, can overetch the tungsten and remove tungsten from within the via. This can result in poor contact between the recessed tungsten within the via and the subsequently deposited aluminum wiring line layer. Moreover, particles remaining on silicon wafer surface after tungsten etch back will be a killer of device. As an alternative to performing an etch back step, CMP processes can be used for removing excess tungsten.

For tungsten CMP, a two step process is conventionally used. In the first step, the wafer is polished at a first polishing station using a slurry having an oxidizer and a low pH to remove the excess tungsten layer from the surface of the insulating layer. The underlying insulating layer may be used as an etch stop during the first CMP step. In the second step, the wafer is moved to a second polishing station in which a high pH slurry is used to planarize and polish the insulating layer. Both steps are conventionally believed necessary because the first polishing step leaves scratches in the insulating layer which can trap contaminants and subsequently cause shorts between conductive structures. The second polishing step is used to buff the scratches out of the insulating layer. Ideally, the second polishing step is carried out so that the thickness of the removed oxide layer during the second polishing step equals the depth of the largest scratch resulting from the first metal removal step. In addition to scratches, the first polishing step may also remove a portion of the tungsten from within the via because the slurry is formulated to remove the tungsten at a greater rate than the dielectric material. The second step of polishing the dielectric layer with a slurry that is selective to the dielectric layer acts to planarize the dielectric layer and the tungsten within the via.

FIG. 1 illustrates a conventional CMP set-up. A wafer 10 is mounted to a wafer carrier 12 above a rotating platen 14. The wafer carrier 12 can exert a force on the wafer 10 and is attached to a rotating spindle 20 so that the wafer can be rotated independently of the platen 14. Polishing pad 16 is disposed on the platen 14 and polishing slurry 18 is supplied to the surface of the rotating pad. As illustrated in FIG. 2, the wafer carrier may include a chuck 22 and backing film 24. The backing film 24 is placed between the wafer 10 and the chuck 22 to provide the desired level of elasticity between the chuck 22 and the wafer 10. If the wafer 10 is held too tightly to the chuck 22, then any particles or non-planar defects in the chuck 22 will be transmitted to the wafer 10 and cause a thin spot or defect within the wafer 10. One or more polishing pads 16 may be used in order to provide the desired level of elasticity between the wafer 10 and the platen 14. If the contact between the polishing pad and the wafer is too rigid, there is an increased risk of wafer breakage. If the polishing pad 16 is too soft, then it will deform into areas on the wafer 10 that are not intended to be polished and uneven amounts of material will be removed from the surface of the wafer. The resultant structure will have a less planar surface than desired. The polishing pad is usually kept somewhat rough, with protrusions of about 1 to 10 $\mu$m built into the pad to hold and transport the polishing slurry.

The exact mechanisms by which chemical mechanical planarization takes place are complex and poorly understood. There are numerous variables related to both the chemical and mechanical aspects of CMP. Chemistry-related factors include the slurry type, slurry pH, slurry solid content, slurry flow, and process temperature. Mechanical-related factors include polishing pressure, back pressure, platen speed, and pad type. The slurry mixture is typically either an acid or base along with an abrasive material such as silicon oxide. For polishing and removing a metal layer such as tungsten, it is conventional to use a slurry solution having an oxidizing component such as $H_2O_2$ and a pH of 2 to 4 in the first step of tungsten CMP. For polishing or planarizing an oxide layer in the second step of tungsten CMP, it is conventional to use an alkali based solution such as KOH with a pH of 10 to 11.5. For uniform polishing it is generally desirable for: (1) each point on the wafer to travel the same velocity relative to the polishing pad; (2) the polishing slurry to be uniformly distributed under the wafer; and (3) the wafer to be symmetrical.

The two steps of the process for removing the excess tungsten and buffing the underlying insulating layer are generally carried out at different polishing stations, or by switching the polishing pad between the first and second CMP steps. Because of differences between the first and second slurries used for polishing the metal and the insulator, the same pad is not used for the first and second CMP steps. If the same pad were used, problems due to pH shock and particle generation will occur because acid-base reactions take place between the first acidic slurry and the second basic slurry and precipitate undesirable particles on the pad. The need for a two step process causes the tungsten CMP process to be more time consuming, expensive and unpredictable than desired.

SUMMARY OF THE PREFERRED EMBODIMENTS

It is an object of the present invention to provide a simplified tungsten CMP process where, through appropriate control of selected process variables, tungsten CMP can be acceptably performed using a single polishing pad or at a single polishing station.

Embodiments of the present invention include a chemical mechanical polishing method comprising the steps of providing a semiconductor wafer including a dielectric layer and a metal layer formed over at least a portion of the dielectric layer. At least one polishing pad is provided for chemical mechanical polishing. A first slurry mixture is provided for polishing the metal layer and the metal layer is polished, leaving a surface of the dielectric layer exposed. A second slurry mixture is provided for polishing the dielectric layer and the dielectric layer is polished after the step of polishing the metal layer. The first slurry mixture and second slurry mixture each have a pH in the range of approximately 2 to approximately 4.

Embodiments also include a method for chemical mechanical polishing a component, the method comprising the steps of providing a dielectric layer and forming at least one via through the dielectric layer. A tungsten layer is formed within the via and over the dielectric layer. A first chemical mechanical polishing step to remove the tungsten layer from over the dielectric layer using a first slurry having an oxidizing component and having a pH of approximately 2 to approximately 4 is performed. A second chemical mechanical polishing step to polish the dielectric layer using a second slurry having a pH in the range of approximately 2 to approximately 4 is performed.

Embodiments also include a method for forming an integrated circuit structure including chemical mechanical polishing a tungsten layer overlying a dielectric layer, the method comprising providing a dielectric layer over a substrate, at least one via through the dielectric layer, a tungsten plug in the via and a tungsten layer over at least a portion of the dielectric layer. A first slurry includes abrasive particles and has a pH of approximately 2 to approximately 4. A second slurry includes abrasive particles and has a pH of approximately 2 to approximately 4. A polishing pad on a chemical mechanical polishing apparatus is provided. A first chemical mechanical polishing step is performed using the first slurry to remove the tungsten layer from over the dielectric layer. A second chemical mechanical polishing step is performed using the second slurry to polish the dielectric layer. The first and second chemical mechanical polishing steps are carried out on the polishing pad.

BRIEF DESCRIPTION OF THE DRAWINGS

Embodiments of the present invention are described with reference to the accompanying drawings which, for illustrative purposes, are schematic and are not drawn to scale, where.

DETAILED DESCRIPTION OF THE PREFERRED EMBODIMENTS

Figure 1:
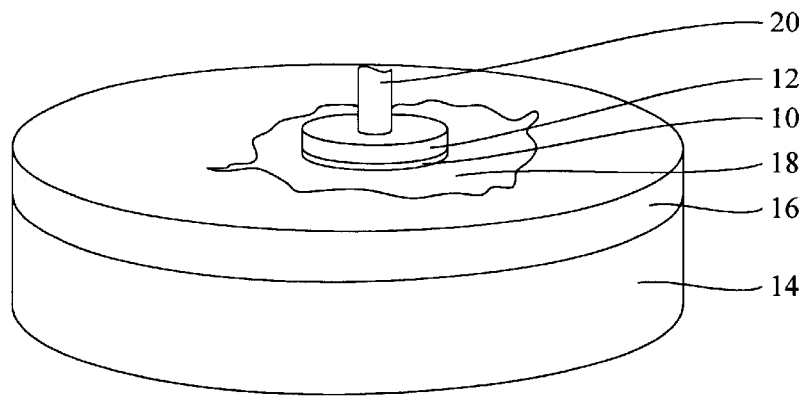
FIG. 1 illustrates a perspective view of a conventional chemical mechanical polishing apparatus.
Figure 2:
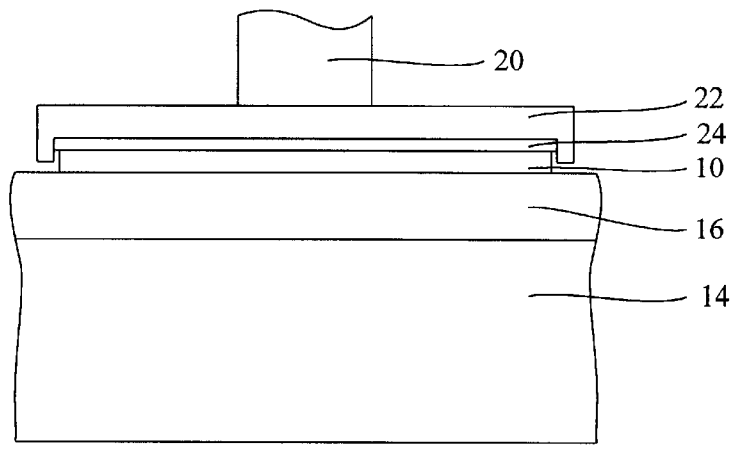
FIG. 2 illustrates a cross-sectional view of a conventional chemical mechanical polishing apparatus.

Conventional tungsten CMP technology includes a multistep process using a first slurry for removing excess tungsten from over a dielectric layer, and a second slurry for polishing or buffing the scratches from the underlying dielectric layer that were formed during the tungsten polishing step. Conventional methods must use two different polishing pads for the different slurries, which generally means two different polishing stations, one set up with a pad and slurry for removing the tungsten, and a second set up with a different pad and different slurry for polishing the underlying dielectric layer. The first slurry conventionally has a pH in the range of 2 to 4. The second slurry conventionally has a pH in the range of 10 to 11.5. The need to use two different polishing pads or stations causes the tungsten CMP process to be slower than desired.

Embodiments of the present invention include a CMP process in which the same polishing pad can be used for polishing the excess tungsten and the underlying dielectric after the excess tungsten has been removed. The present inventors have found that a first slurry for removing the tungsten and a second slurry for polishing the underlying insulating layer may be used one after the other on the same polishing pad by forming first and second slurries that both have similar, low pH values. Conventional methods must use two pads, which generally means two different polishing stations, one set up with a pad and slurry for removing the tungsten, and a second set up with a different pad and different slurry for polishing the underlying insulating layer. The first slurry conventionally has a pH in the range of 2 to 4. The second slurry conventionally has a pH in the range of 10 to 11.5. Preferred embodiments of the present invention include first and second slurries for polishing tungsten and polishing oxide, respectively, each having a pH in the range of approximately 2 to approximately 4.

In preferred embodiments of the present invention, certain parameters relating to the particle size in the slurry, the specific gravity of the slurry mixture, the hardness and the compressibility of the polishing pad are controlled to limit the level of scratching that occurs in the tungsten polishing process. Applicants have found that careful control of the pH of the slurry mixtures can eliminate the need to use separate polishing stations for the tungsten and oxide polishing steps. Preferred embodiments of the present invention utilize low pH slurries for the excess tungsten removal step and for the insulating layer polishing step in a tungsten CMP process. For example, a slurry including $H_2O$, $Al_2O_3$ abrasive particles, and $Fe(NO_3)_3$ as an oxidizing component may be used for the first slurry. The $Fe(NO_3)_3$ may be present in an amount of approximately 5 to approximately 10 wt. percent of the slurry mixture. Other oxidizing components such as $KIO_3$ may also be used. A preferred low pH slurry for the insulating layer polishing step is supplied by Solution Technology, Inc., of North Carolina, under the product name Klebsol, which has a pH in the range of approximately 2 to approximately 4.

Figure 3:
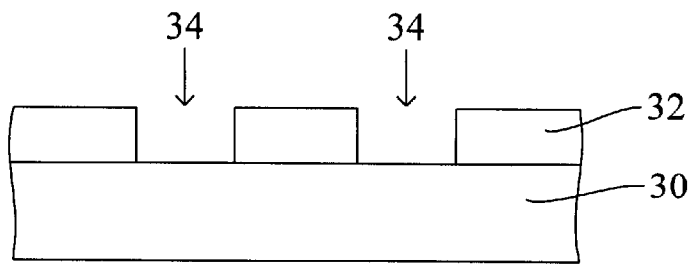
FIGS. 3–10 illustrate steps in the formation of a structure including chemical mechanical polishing according to embodiments of the present invention.
Figure 4:
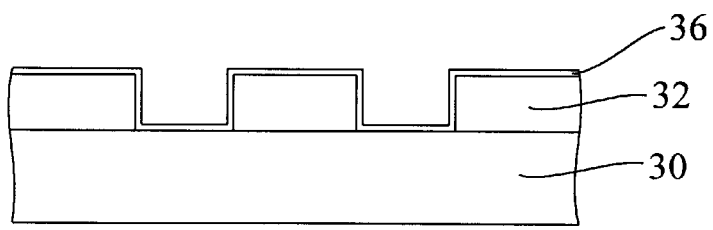
Figure 5:
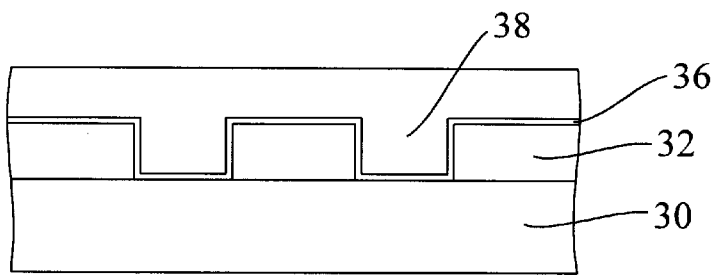

An example of an embodiment of the present invention includes the formation of a wafer including structures having a first level wiring line, an interlevel dielectric layer deposited over the wiring line, a via formed through the interlevel dielectric layer to expose a portion of the first level wiring line, and a metal deposited into the via to form a vertically extending interconnect or "plug." A second level of wiring lines is then formed over the interlevel dielectric layer, with the plug connecting the first level wiring line to other conductors in the circuit. The interlevel dielectric layer provided between wiring line layers is often an oxide material deposited using atmospheric pressure chemical vapor deposition (APCVD) or plasma-enhanced chemical vapor deposition (PECVD) with a TEOS precursor gas. As illustrated in FIG. 3, the structure includes interlevel dielectric layer 32 over first wiring line layer 30. Contact vias 34 are formed through the dielectric layer 32. A barrier or adhesion layer 36 is preferably deposited over the dielectric layer 32 and within the vias 34, as illustrated in FIG. 4. Preferably the barrier layer 36 is formed from titanium or titanium nitride. A tungsten plug 38 is then formed within the vias 34 and over the dielectric layer 32, as illustrated in FIG. 5. The tungsten plug 38 may be formed by CVD of tungsten using $WF_6$ as a source gas.

Figure 6:
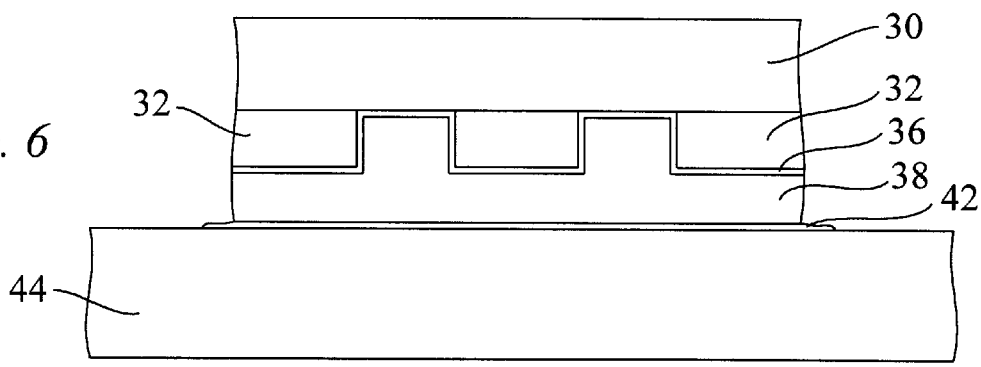
Figure 7:
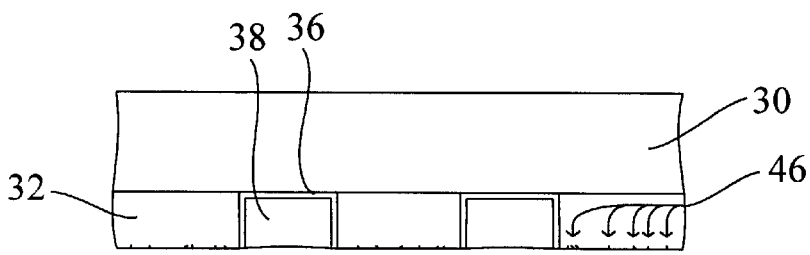
Figure 8:
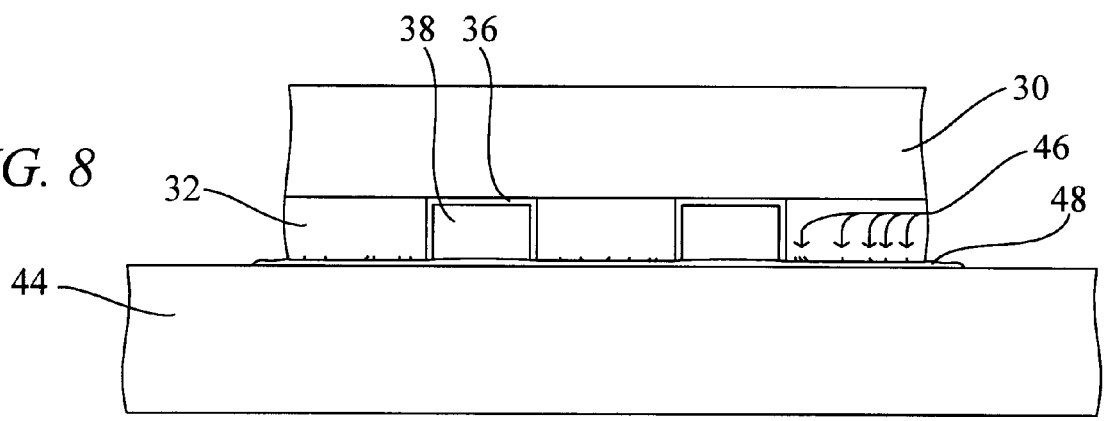
Figure 9:
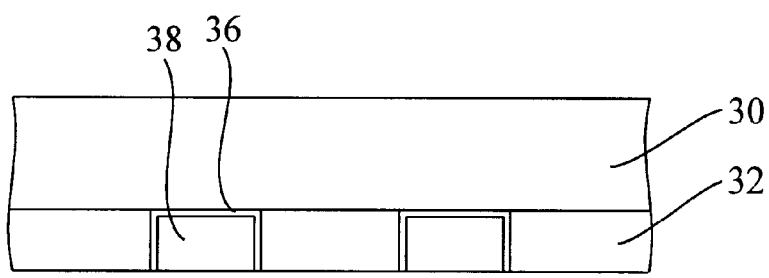

After tungsten deposition, the wafer is transported to a CMP station and the excess tungsten 38 is brought into contact with a first slurry mixture 42 on a polishing pad 44, as illustrated in FIG. 6. The slurry mixture 42 has a pH in the range of 2 to 4 and includes an oxidizing component for oxidizing the tungsten. The CMP is performed to remove the excess tungsten metal from the surface of the oxide layer 32. This first CMP step may result in the formation of scratches 46 being present in the underlying oxide layer 32, as illustrated in FIG. 7. The first CMP step may also remove a portion of the tungsten 38 from within the vias, due to the selectivity of the first slurry towards tungsten. A second CMP step is then carried out by stopping the supply of the first slurry to the polishing pad 44 and initiating supply of a second slurry 48 for polishing the oxide layer 32 including the scratches 46, as illustrated in FIG. 8. The second slurry 48 has a pH in the range of 2 to 4 to avoid pH shock as the second slurry is introduced to the polishing pad. The second CMP step preferentially polishes the oxide layer, removing scratches 46 and yielding a planar surface as illustrated in FIG. 9.

Figure 10:
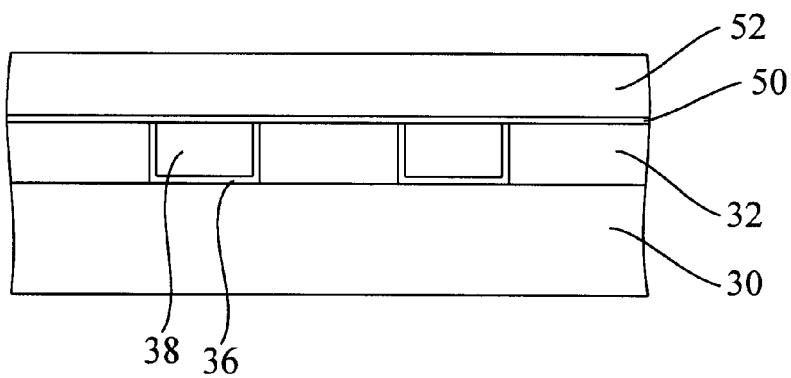

After the CMP steps are complete, the barrier layer 36 will have been removed and a second barrier layer 50 is preferably deposited over the oxide layer 32. A conducting layer 52 such as aluminum is then deposited over the second barrier layer 50 and in electrical contact with the plug 38 to form a second level wiring line layer, as illustrated in FIG. 10. Patterning of the aluminum layer and the barrier layer may be performed in the conventional manner to form second level wiring lines.

The processes described herein are compatible with a range of different materials used in integrated circuit devices. While the present invention has been described in terms of a particular type of layered structure and a particular wiring line structure, this should be understood as generically referring to a structure formed on a substrate. The method does not require the presence of a via or that alternate layers be conducting and insulating materials, although certain aspects of the present invention will find their most preferred application to such structures. Those of ordinary skill in the art will appreciate that various modifications and alterations to the embodiments described herein might be made without altering the basic function of the present invention. Accordingly, the scope of the present invention is not limited to the particular embodiments described herein; rather, the scope of the present invention is to be determined from the following claims.

What is claimed:

1. A chemical mechanical polishing method, comprising the steps of:
    providing a semiconductor wafer including a dielectric layer and a metal layer formed over at least a portion of the dielectric layer;
    providing at least one polishing pad for chemical mechanical polishing;
    providing a first slurry mixture for polishing the metal layer;
    polishing the metal layer using the first slurry mixture, leaving a surface of the dielectric layer exposed;
    providing a second slurry mixture for polishing the dielectric layer; and
    polishing the dielectric layer after the step of polishing the metal layer,
    wherein the first slurry mixture and second slurry mixture each have a pH in the range of approximately 2 to approximately 4, and
    wherein the first slurry mixture includes water, $Fe(NO_3)_3$, $H_2O_2$ and $Al_2O_3$.

2. A chemical mechanical polishing method, comprising the steps of:
    providing a semiconductor wafer including a dielectric layer and a metal layer formed over at least a portion of the dielectric layer;
    providing at least one polishing pad for chemical mechanical polishing;
    polishing a first slurry mixture for polishing the metal layer;
    polishing the metal layer using the first slurry mixture, leaving a surface of the dielectric layer exposed;
    providing a second slurry mixture for polishing the dielectric layer; and
    polishing the dielectric layer after the step of polishing the metal layer,
    wherein the first slurry mixture and second slurry mixture each have a pH in the range of approximately 2 to approximately 4, and
    wherein the first slurry mixture includes $Fe(NO_3)_3$, $H_2O_2$ and $KIO_3$.

3. A method for chemical mechanical polishing a component, comprising:
    providing a dielectric layer;
    forming at least one via through the dielectric layer;
    forming a tungsten layer within the via and over the dielectric layer;
    performing a first chemical mechanical polishing step and removing the tungsten layer from over the dielectric layer using a first slurry having an oxidizing component and having a pH of approximately 2 to approximately 4, wherein the first slurry includes a component selected from the group consisting of $Fe(NO_3)_3$, $H_2O_2$ and $KIO_3$; and
    performing a second chemical mechanical polishing step and polishing the dielectric layer using a second slurry having a pH in the range of approximately 2 to approximately 4.

* * * * *